(12) United States Patent
England

(10) Patent No.: US 10,163,864 B1
(45) Date of Patent: Dec. 25, 2018

(54) VERTICALLY STACKED WAFERS AND METHODS OF FORMING SAME

(71) Applicant: GLOBALFOUNDRIES INC., Grand Cayman (KY)

(72) Inventor: Luke G. England, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/678,642

(22) Filed: Aug. 16, 2017

(51) Int. Cl.
*H01L 23/02* (2006.01)
*H01L 25/065* (2006.01)
*H01L 23/528* (2006.01)
*H01L 23/00* (2006.01)
*H01L 21/306* (2006.01)
*H01L 21/3105* (2006.01)
*H01L 25/00* (2006.01)
(Continued)

(52) U.S. Cl.
CPC .... *H01L 25/0657* (2013.01); *H01L 21/30604* (2013.01); *H01L 21/31053* (2013.01); *H01L 21/6835* (2013.01); *H01L 21/76898* (2013.01); *H01L 23/528* (2013.01); *H01L 24/03* (2013.01); *H01L 24/05* (2013.01); *H01L 24/13* (2013.01); *H01L 24/27* (2013.01); *H01L 24/29* (2013.01); *H01L 24/32* (2013.01); *H01L 24/83* (2013.01); *H01L 25/50* (2013.01); *H01L 23/5226* (2013.01); *H01L 2221/68327* (2013.01); *H01L 2221/68359* (2013.01); *H01L 2224/04026* (2013.01); *H01L 2224/05025* (2013.01); *H01L 2224/13025* (2013.01); *H01L 2224/27002* (2013.01); *H01L 2224/29187* (2013.01); *H01L 2224/32146* (2013.01); *H01L 2224/832* (2013.01); *H01L 2224/83005* (2013.01); *H01L 2224/83895* (2013.01); *H01L 2224/83896* (2013.01); *H01L 2225/06541* (2013.01); *H01L 2225/06565* (2013.01); *H01L 2924/14* (2013.01)

(58) Field of Classification Search
CPC ....... H01L 2224/32145; H01L 25/0657; H01L 2224/16145; H01L 23/49827
USPC .................................................. 257/686, 777
See application file for complete search history.

(56) References Cited

U.S. PATENT DOCUMENTS 3,648,131 A * 3/1972 Stuby ................ H01L 21/76898
148/DIG. 135
6,984,571 B1 1/2006 Enquist
(Continued)

*Primary Examiner* — S. V. Clark
(74) *Attorney, Agent, or Firm* — Yuanmin Cai; Hoffman Warnick LLC

(57) ABSTRACT

The disclosure is directed to an integrated circuit stack and method of forming the same. In one embodiment, the integrated circuit stack may include: a plurality of vertically stacked wafers, each wafer including a back side and a front side, the back side of each wafer including a through-semiconductor-via (TSV) within a substrate, and the front side of each wafer including a metal line within a first dielectric, wherein the metal line is connected with the TSV within each wafer; and an inorganic dielectric interposed between adjacent wafers within the plurality of vertically stacked wafer; wherein the plurality of vertically stacked wafers are stacked in a front-to-back orientation such that the TSV on the back side of one wafer is electrically connected to the metal line on the front side of an adjacent wafer by extending through the inorganic dielectric interposed therebetween.

14 Claims, 7 Drawing Sheets

(51) Int. Cl.
  *H01L 21/768* (2006.01)
  *H01L 21/683* (2006.01)
  *H01L 23/522* (2006.01)

(56) References Cited

U.S. PATENT DOCUMENTS

| | | | |
|---|---|---|---|
| 7,385,283 B2 | 6/2008 | Wu et al. | |
| 7,485,968 B2 | 2/2009 | Enquist et al. | |
| 8,400,781 B2* | 3/2013 | Gillingham | G11C 5/02 |
| | | | 216/18 |
| 8,563,403 B1 | 10/2013 | Farooq et al. | |
| 8,637,969 B2* | 1/2014 | Lee | H01L 21/561 |
| | | | 257/686 |
| 8,664,081 B2 | 3/2014 | Farooq et al. | |
| 8,802,538 B1 | 8/2014 | Liu et al. | |
| 9,553,080 B1 | 1/2017 | England et al. | |
| 2009/0273068 A1* | 11/2009 | Kaskoun | H01L 23/3677 |
| | | | 257/686 |
| 2010/0007001 A1* | 1/2010 | Wang | H01L 23/481 |
| | | | 257/686 |
| 2010/0264551 A1 | 10/2010 | Farooq | |
| 2011/0101537 A1 | 5/2011 | Barth et al. | |
| 2011/0108972 A1* | 5/2011 | Foster, Sr. | H01L 25/0657 |
| | | | 257/686 |
| 2011/0120811 A1* | 5/2011 | Kallioniemi | B66B 1/2458 |
| | | | 187/382 |
| 2012/0038045 A1 | 2/2012 | Lee | |
| 2013/0026643 A1 | 1/2013 | England et al. | |
| 2013/0162282 A1 | 6/2013 | Hatakeyama et al. | |
| 2016/0343679 A1 | 11/2016 | Chen et al. | |

* cited by examiner

VERTICALLY STACKED WAFERS AND METHODS OF FORMING SAME

BACKGROUND

Technical Field

The present disclosure relates to vertically stacked wafers, and more specifically, the disclosure relates to wafers vertically stacked in a front-to-back orientation using hybrid-oxide bonding, and methods of forming the same.

Related Art

Generally, a plurality of devices/components (e.g., transistors, diodes, etc.) may be designed and embedded into an integrated circuit (IC) chip/die, which then may be placed into a package (e.g., plastic casing) or used as a bare die for placement onto a printed circuit board (PCB) of an electronic device. In addition to traditional technology node scaling at the transistor level, three-dimensional (3D) IC chip stacking is increasingly being utilized to continue the use of current semiconductor manufacturing technologies (e.g., 28 nm, 22 nm, etc.) to create 3D system-on-chip (SoC) devices and provide solutions for meeting performance, power, and bandwidth requirements of various electronic devices. A 3D SoC device may include several logic, memory, analog, or other chips of different technology nodes that may be connected to each other by using through-semiconductor-via (TSV) architecture. Typically, TSVs are vertical vias etched into a semiconductor layer and filled with a conductive material (e.g., copper (Cu)), to provide connectivity for transferring electronic signals or power supplies between the vertically stacked IC chips or between an IC chip and an IC package substrate.

In a 3D SoC device, individual SoC functional blocks may be partitioned onto individual IC chips for connection during 3D IC packaging, where shorter wire lengths in the 3D configuration allow for performance gains and a decrease in overall power consumption of the device. Also, reduction in wire lengths reduces total number of back end of line (BEOL) metal layers needed, i.e., connection layers after active device layers. In a homogeneous application of a 3D SoC device, functional blocks within a single technology node are partitioned resulting in a smaller die/chip size on semiconductor wafers for increased yield and device-per-wafer efficiency. Such an application may allow for extension of existing technology for further manufacturing on currently available/purchased manufacturing toolsets resulting in extension of 14 nm technology node and delaying a need for a reduction (e.g., 10 nm scaling) in the technology node. In a heterogeneous application of a 3D SoC device, the block partitioning may be targeted based on scalability, wherein higher scalable digital cores and intellectual property (IP) are scaled to advanced technology nodes. Devices that may not scale well, such as state random access memory (SRAM), input/outputs (I/Os), and other analog devices may be manufactured on older technology. Such an application may result in higher overall yield and reduced cost due to the possibility of using older technology for part of the system.

A 3D SoC device/IC chip stack may be formed by face-to-face (F2F) bonding of vertically aligned semiconductor wafers that include an array of IC chips on each wafer, where bonded 3D IC chips may be separated from each other through dicing lanes between adjacent bonded 3D IC chips. A current industry approach for 3D SoC devices includes wafer bonding in a F2F configuration, where TSVs are etched into one of the wafers (e.g., bottom wafer) after the bonding is completed (TSV-last approach). However, a TSV-last approach requires sophisticated alignment, design and process techniques. Also, the TSV structures and quality in a 3D SoC device using a TSV-last approach may be negatively impacted as etching of a TSV from the backside of an IC substrate may be difficult, e.g., causing a "blowout" when reaching the TSV contact point.

A 3D SoC device/IC chip may also be formed by face-to-back (F2B) bonding of vertically aligned semiconductor wafers. A current industry approach for F2B 3D SoC devices includes using standard flip chip interconnects. This approach includes depositing solder bumps on pads on the top side of the wafer and aligning the pads with corresponding pads on another wafer. Once pads are aligned, the solder is reflowed in order to complete the interconnect structure. However, such approaches result in elevated capacitance loading, poor thermal performance, and difficult interconnect yields relative to shrinking dies and pitch of solder structures.

SUMMARY

A first aspect of the disclosure is directed to an integrated circuit stack. The integrated circuit stack including: a first wafer attached to a second wafer in a front-to-back orientation, wherein each wafer includes a back side and a front side, the back side of each wafer including a through-semiconductor-via (TSV) within a substrate, and the front side of each wafer including a metal line within a first dielectric, wherein the metal line is connected with the TSV within each respective wafer, and a second dielectric interposed between the substrate of the first wafer and the first dielectric of the second wafer, wherein the TSV of the first wafer extends from the substrate of the first wafer through the second dielectric and is electrically connected to the metal line within the first dielectric of the second wafer.

A second aspect of the disclosure is directed to a method of forming an integrated circuit stack. The method may include: attaching a first wafer and a second wafer in a front-to-back orientation, the attaching including attaching a metal line within a first dielectric on a front side of the second wafer to a through-semiconductor-via (TSV) within a substrate on a back side of a first wafer by hybrid-oxide bonding.

A third aspect of the disclosure is directed to an integrated circuit stack. The integrated circuit stack may include: a plurality of vertically stacked wafers, each wafer including a back side and a front side, the back side of each wafer including a through-semiconductor-via (TSV) within a substrate, and the front side of each wafer including a metal line within a first dielectric, wherein the metal line is connected with the TSV within each wafer; and an inorganic dielectric interposed between adjacent wafers within the plurality of vertically stacked wafer; wherein the plurality of vertically stacked wafers are stacked in a front-to-back orientation such that the TSV on the back side of one wafer is electrically connected to the metal line on the front side of an adjacent wafer by extending through the inorganic dielectric interposed therebetween.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIGS. 1-8 show cross-sectional views of an integrated circuit stack undergoing embodiments of a method according to the disclosure, wherein FIG. 8 shows a resulting integrated circuit stack according to the disclosure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The present disclosure relates to vertically stacked wafers, and more specifically, the disclosure relates to wafers vertically stacked in a front-to-back orientation using hybrid-oxide bonding, and methods of forming the same. Embodiments of the present disclosure include a hybrid-oxide bonding structure wherein a through-semiconductor-via (TSV) within a substrate on a front side of a wafer is electrically connected to a metal line within a dielectric on a back side of another, adjacent wafer. The TSV extends through an inorganic dielectric interposed between the two wafers in order to make appropriate connections. As a result, this structure eliminates the need for micropillar interconnect and polymer underfill layers which add unwanted capacitance and thermal resistance, respectively, to the integrated circuit stack. Further, this structure eliminates the need for extra metal layers that are conventionally added to the back side of the wafer.

Figure 1:
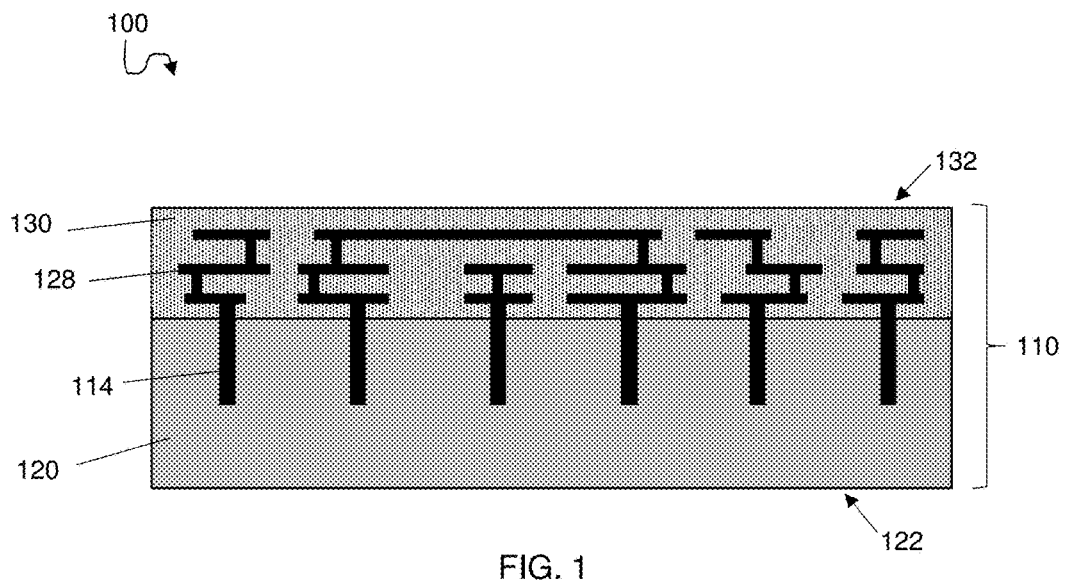

As will be described herein, methods according to embodiments of the disclosure may include attaching a first wafer and a second wafer in a front-to-back orientation. More specifically, the attaching may include attaching a metal line within a first dielectric on a front side of the second wafer to a through-semiconductor-via (TSV) within a substrate on a back side of a first wafer by hybrid-oxide bonding. Turning now to FIG. 1, methods may include providing a preliminary integrated circuit (IC) 100 including a first wafer 110. Wafer 110 may include a metal line or wire 128 within a dielectric 130 to form a front side 132 of wafer 110. Together, wires 128 and dielectric 130 define back-end-of-the-line (BEOL) layers. Further, wafer 110 may include a TSV 114 within a substrate 120 that is connected to the first wiring level 128 of wafer 110. As shown, substrate 120 may include any currently-known or later developed material capable of being processed into a transistor structure, and may include, e.g., a bulk semiconductor layer, a semiconductor-on-insulator (SOI) substrate, etc. Substrate 120 may include any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of substrate 120 or a portion thereof may be strained.

Dielectric 130 may include, for example, at least one of: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and other low dielectric constant (<3.9) material, or layers thereof.

TSV 114 and metal line 128 may each include a conductive liner and a conductive fill (not individually shown herein for brevity). Conductive liner may include, e.g., at least one of: titanium nitride, tantalum nitride, tungsten nitride, tantalum, titanium, or other thermally stable material. The conductive fill may include, e.g., at least one of: titanium, tungsten, tantalum, aluminum, copper, or alloys thereof. In addition, TSV 114 may also be substantially surrounded by an insulative liner as is known in the art but not shown herein for brevity. The insulative liner may include, e.g., an oxide, such as silicon dioxide or hafnium oxide, or nitride, such as silicon nitride. While not shown here, substrate 120 may include front-end-of-the-line (FEOL) structures, e.g., transistors, resistors, capacitors, etc., to which TSV 114 provides electrical connection. Wafer 110 may be formed by conventional deposition, etching and planarization techniques.

Figure 2:
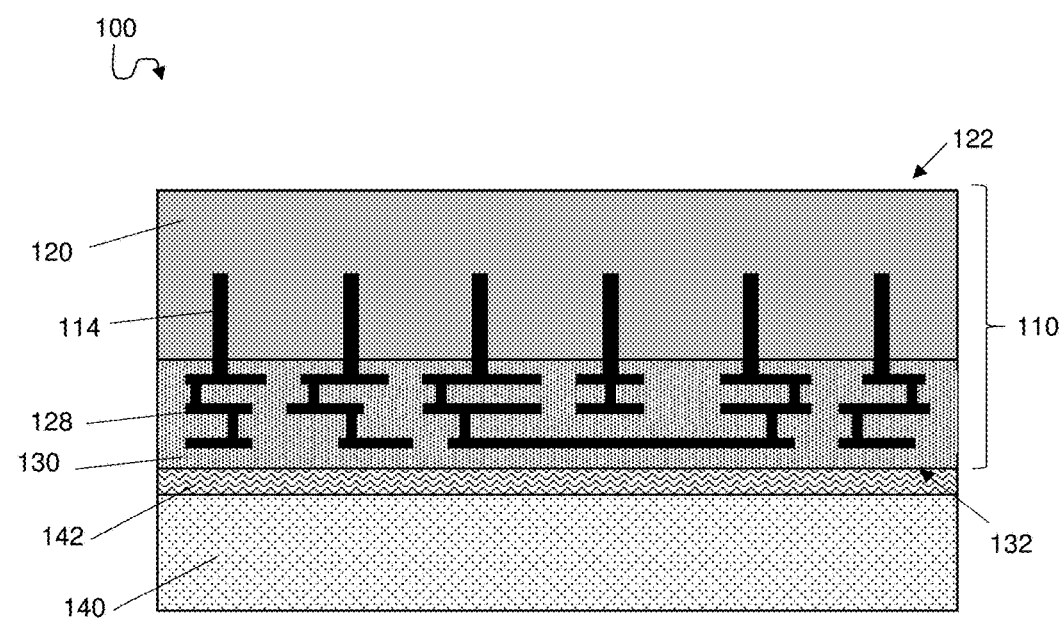

Turning now to FIG. 2, wafer 110 may be flipped or turned over and attached to a temporary handle wafer 140, which may be formed on front side 132 of wafer 110. Temporary handle wafer 140 may include, e.g., glass, bulk silicon, or sacrificial silicon. In some embodiments, for example, where glass or bulk silicon are used for temporary handle wafer 140, a bonding layer 142 such as an adhesive or glue may be used to attach temporary handle wafer 140 to wafer 110. Where the sacrificial silicon is used for temporary handle wafer 140, the sacrificial silicon may be attached via direct dielectric bonding between the sacrificial silicon of temporary handle wafer 140 to dielectric 130 of wafer 110. In this case, bonding layer 142 is a dielectric material that is similar in composition to dielectric 130 on front side 132. The dielectric material of bonding layer 142 in this embodiment facilitates bonding of handle wafer 140 to dielectric 130 of wafer 110 through the bonding of dangling bonds between bonding layer 142 and dielectric 130. As will be described herein, after the desired number of wafers are attached together and a resulting IC stack is formed, temporary handle wafer 140 may be removed. Temporary handle wafer 140 provides mechanical support to wafer 110 such that wafer 110 may be manipulated to undergo additional processing.

Figure 3:
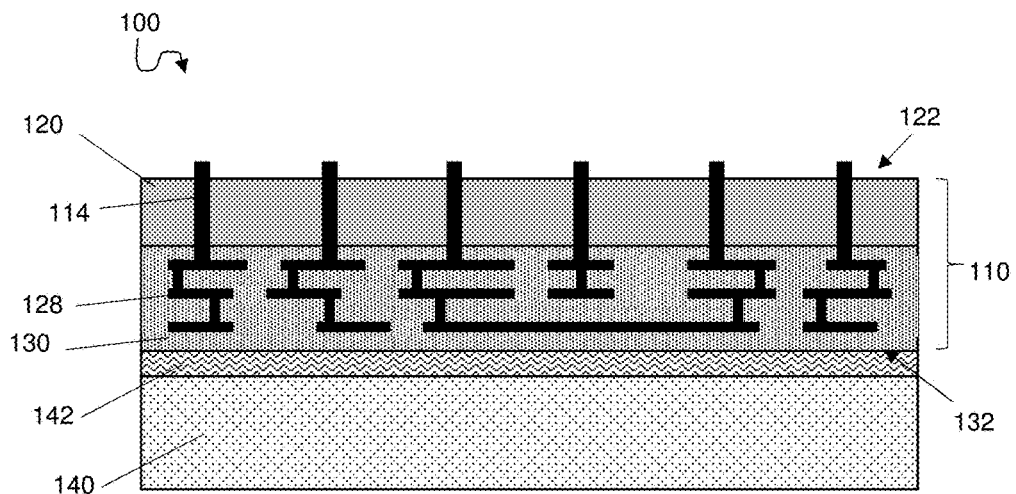

As shown in FIG. 3, an etching or grinding may be performed to reveal or expose TSVs 114. That is, portions of substrate 120 may be removed (by etching or grinding) to reveal or expose TSVs 114 on back side 122 of wafer 110. The etching or grinding may include, for example, a mechanical grind followed by a blanket dry or wet etch. Wafer 100 may start with a thickness of approximately 750 micrometers (μm), for example. The amount of substrate 120 that is removed may depend on the depth of TSVs 114 within substrate 120. In one example, a mechanical etch may be used to etch substrate 120 to within approximately 3 μm to approximately 5 μm of TSVs 114. Subsequently, a blanket wet or dry etch may be used to remove additional portions of substrate 120 to expose TSVs 114. However, it is to be understood that any desired amount of substrate 120 may be removed depending on the depth of the TSVs 114 that are etched from front side 132 of wafer 110. Where there is an insulative liner around TSVs 114, this etching may reveal the insulative liner around TSVs 114.

"Etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a chemical (such as an acid) which may be chosen for its ability to selectively dissolve a given material (such as oxide), while leaving another material (such as polysilicon) relatively intact. The ability to selectively etch particular materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutral or charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

Figure 4:
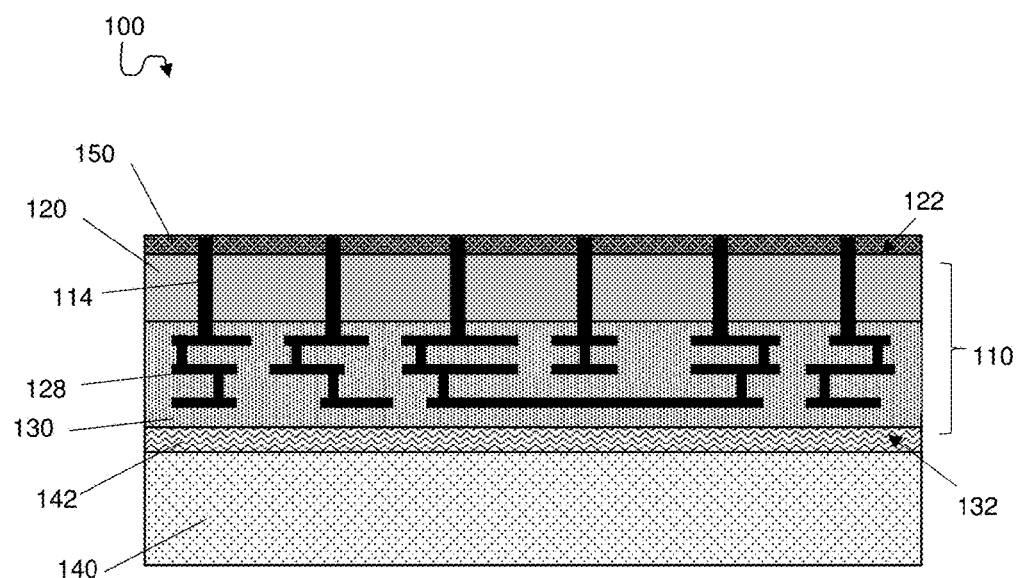

Turning now to FIG. 4, a dielectric 150 may be formed on substrate 120 and TSVs 114 of wafer 110. Dielectric 150 may be formed by, for example, deposition. As used herein, "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation. More specifically, dielectric 150 may be formed by a low temperature (less than about 400° C.) chemical vapor deposition technique. Dielectric 150 may be deposited to a thickness of greater than approximately 0.5 micrometers (μm). Dielectric 150 may include, e.g., an inorganic dielectric material such as hydrogenated silicon oxycarbide (SiCOH), organosilicate glass (OSG), silicon oxide ($SiO_2$), silicon nitride (SiN), flourinated $SiO_2$ (FSG), methylsilesquoxane (MSQ), or porous versions thereof. Further, dielectric 150 may be planarized to TSVs 114 of wafer 110. During this planarization, any insulative liner that was surrounding TSVs 114 may also be removed. As a result, dielectric 150 and any insulative liner may be planarized to the conductive liner of TSV 114. As a result, conductive portions of TSV 114 are exposed.

Planarization may refer to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This removes material and tends to even out any "topography," making the wafer flat and planar. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; gas-cluster ion-beam; and/or (x) sacrificial etch-back Turning now to FIG. 5, a second wafer 210 may be attached to wafer 110 to form an integrated circuit (IC) stack 200. Wafer 210 may be substantially similar to wafer 110, and thus, include a similar numbering scheme such that like numbers in the 200s correspond to structures in wafer 210 that are similar to like-numbered structures in wafer 110. In addition to metal lines 228 within dielectric 230 of wafer 210, conductive pads 252 may also be disposed within dielectric 230. Conductive pads 252 may include a surface that is substantially planar with front side 232 of wafer 210 such that conductive pads 252 are exposed at front side 232 of wafer 210. Like TSVs 114, 214 and metal lines 128, 228, conductive pads may include a conductive liner and a conductive fill. The conductive liner of conductive pads 252 may include, e.g., at least one of: titanium nitride, tantalum nitride, tungsten nitride, tantalum, titanium, or other thermally stable material. The conductive fill of conductive pads 252 may include, e.g., at least one of: titanium, tungsten, tantalum, aluminum, copper, or alloys thereof.

Wafer 210 may be attached to wafer 110 in a front-to-back orientation. That is, front side 232 of wafer 210 may be attached to back side 122 of wafer 110. During this attaching, the conductive pads 252 of wafer 210 may be aligned with revealed TSVs 114 within back side 122 of wafer 110. A hybrid-oxide bonding process may, for example, be utilized for the bonding of TSVs 114 and conductive pads 252 in the opposing wafers 110, 210. A hybrid-oxide bonding process includes wafer bonding of planarized dielectric and conductive surfaces, e.g., dielectric 150 on wafer 110 to dielectric 230 on back side 232 of wafer 210. An initial bonding may be completed by pre-treating the dielectric surfaces of the two wafers 110, 210 with a plasma or wet clean and then bringing wafers 110, 210 into contact to allow the dangling bonds of dielectrics 130, 150 to attract one another. These process steps may be done at room temperature or an elevated temperature. A subsequent thermal anneal may be completed to strengthen the dielectric bond and to drive diffusion between two opposing conductive structures (e.g., conductive pads 252 and TSVs 114) thereby forming a single conductive interconnect structure. In this way, the anneal electrically connects TSVs 114 of first wafer 110 and metal lines 228 of second wafer 210 via conductive pads 252. For example, a thermal anneal at approximately 250° C. to approximately 350° C. may be performed for approximately 1.5 hours. However, this example is not intended to be limiting and other temperatures and timing parameters may be used depending on desired application of IC stack 200.

Figure 5:
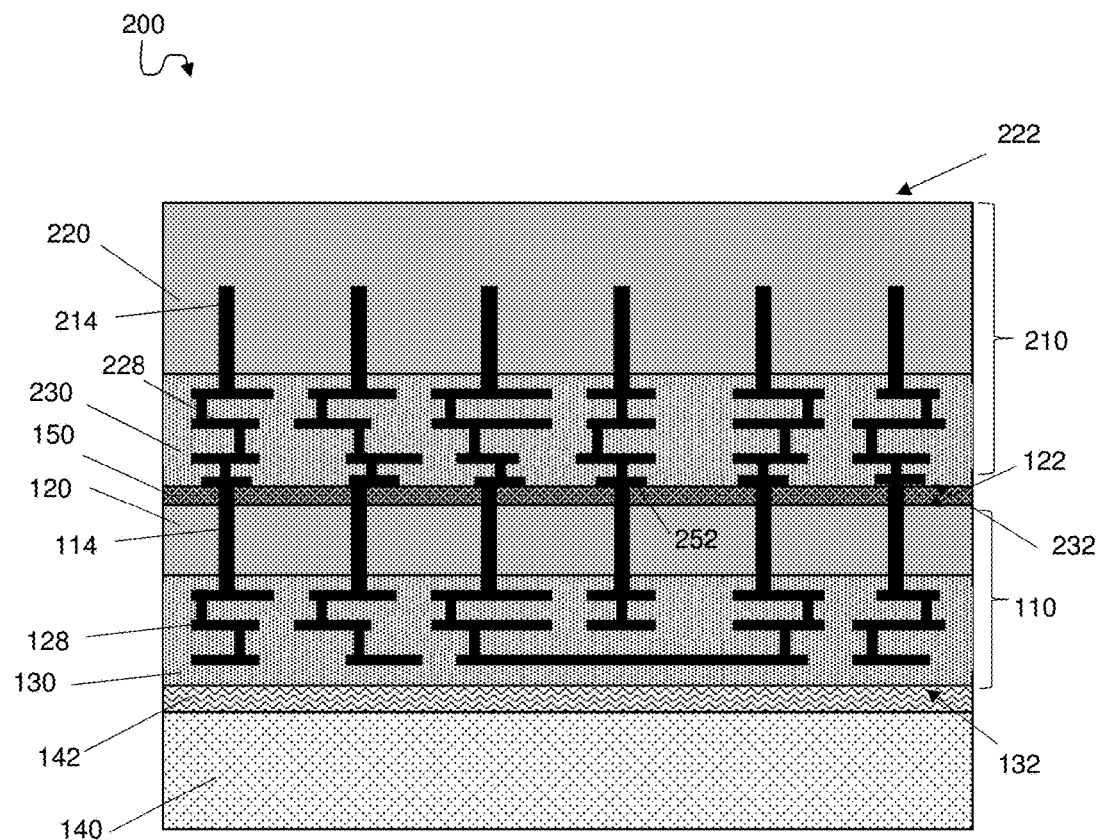

Still referring to FIG. 5, integrated stack 200 may include wafer 110 attached to wafer 210 in a front-to-back orientation by hybrid-oxide bonding. Each wafer 110, 210 may include back side 122, 222 and front side 132, 232. Back side 122, 222 of each wafer 110, 210 may include one or more (or a plurality of) TSVs 114, 214 within substrate 120, 220. Front side 132, 232 of each wafer 110, 210 may include one or more (or a plurality of) metal lines 128, 228 within dielectric 130, 230. Metal lines 128 within dielectric 130 may be connected to TSVs 114 within substrate 120 of wafer 110. Metal lines 228 within dielectric 230 may be connected to TSVs 214 within substrate 220 of wafer 210. Dielectric 150 may be disposed between substrate 120 of wafer 110 and dielectric 230 of wafer 210. Dielectric 150 may include an inorganic dielectric material such as, at least one of: hydrogenated silicon oxycarbide (SiCOH), organosilicate glass (OSG), silicon oxide ($SiO_2$), silicon nitride (SiN), flourinated $SiO_2$ (FSG), methylsilesquoxane (MSQ), or porous versions thereof. TSV 114 of wafer 110 may extend from substrate 120 through dielectric 150 and electrically connect with metal lines 228 via conductive pads 252 within dielectric 230 of wafer 210.

Figure 6:
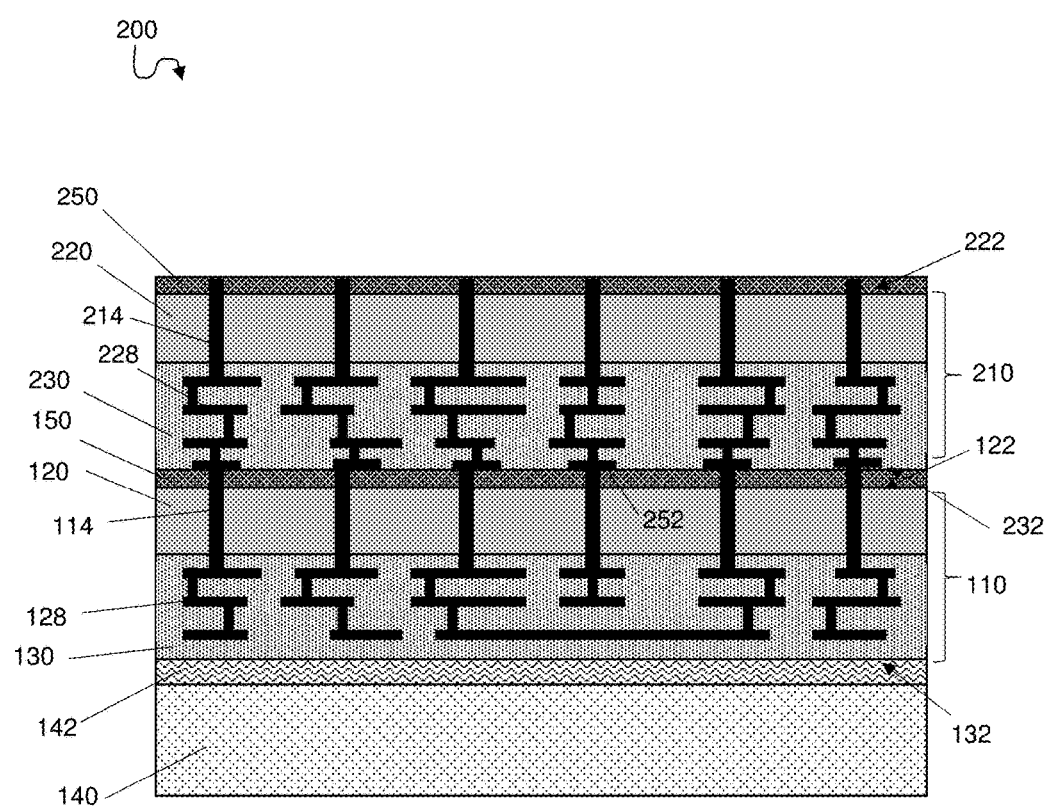
Figure 7:
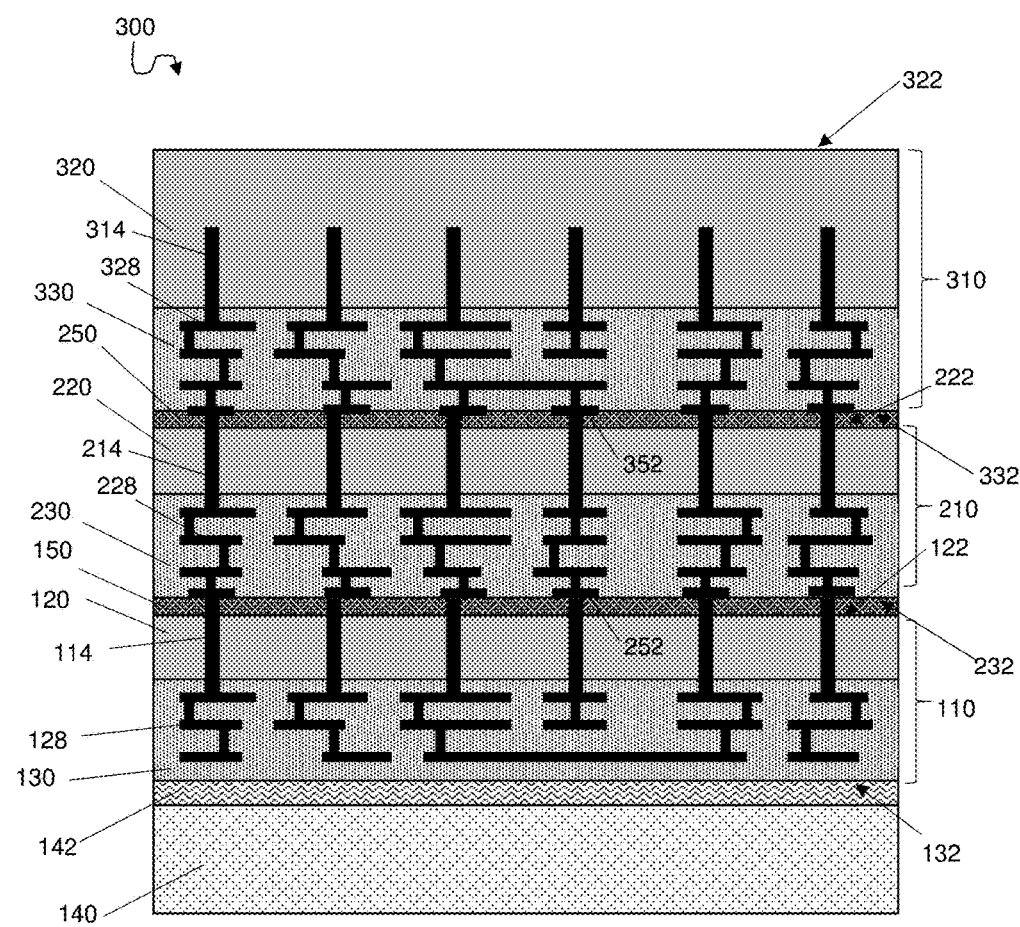

Turning now to FIG. 6, the process may be repeated for any number of wafers that are desired to be attached. That is, substrate 220 may be etched to reveal TSVs 214 of wafer 210 and dielectric 250 may be formed thereover. Dielectric 250 may include any of the dielectric materials listed relative to dielectric 150. Dielectric 250 (and any insulative liner (not shown)) may be planarized to reveal conductive portions of TSVs 214 as discussed relative to FIG. 4. As shown in FIG. 7, a third wafer 310 may be attached to wafer 210 to form IC stack 300. Wafer 310 may be substantially similar to wafers 110, 210, and thus, include a similar numbering scheme such that like numbers in the 300s correspond to structures in wafer 310 that are similar to like-numbered structures in wafers 110, 210. In addition to metal lines 328 within dielectric 330 of wafer 310, conductive pads 352 may also be disposed within dielectric 330. Conductive pads 352 may include a surface that is substantially planar with front side 332 of wafer 310 such that conductive pads 352 are exposed at front side 332 of wafer 310.

Wafer 310 may be attached to wafer 210 in a front-to-back orientation. That is, front side 332 of wafer 310 may be attached to back side 222 of wafer 210. During this attaching, conductive pads 352 of wafer 310 may be aligned with revealed TSVs 214 within back side 222 of wafer 210. A hybrid-oxide bonding process may, for example, be utilized for the bonding of TSVs 214 and conductive pads 352 in the opposing wafers 210, 310. An initial bonding may be completed by pre-treating the dielectric surfaces (e.g., dielectric 250 and dielectric 330) of the two wafers 210, 310 with a plasma or wet clean and then bringing wafers 210, 310 into contact to allow the dangling bonds of dielectrics 250, 330 to attract to one another. These process steps may be done at room temperature or an elevated temperature. A subsequent thermal anneal may be completed to strengthen the dielectric bond and to drive diffusion between two opposing conductive structures (e.g., conductive pads 352 and TSVs 214) thereby forming a single conductive interconnect structure. For example, a thermal anneal at approximately 250° C. to approximately 350° C. may be performed for approximately 1.5 hours. However, this example is not intended to be limiting and other temperatures and timing parameters may be used depending on desired application of IC stack 200. However, where multiple wafers are vertically stacked into a single IC stack, a single anneal may be performed after the desired number of wafers are attached to one another in order to avoid damage to structures therein due to over annealing.

Figure 8:
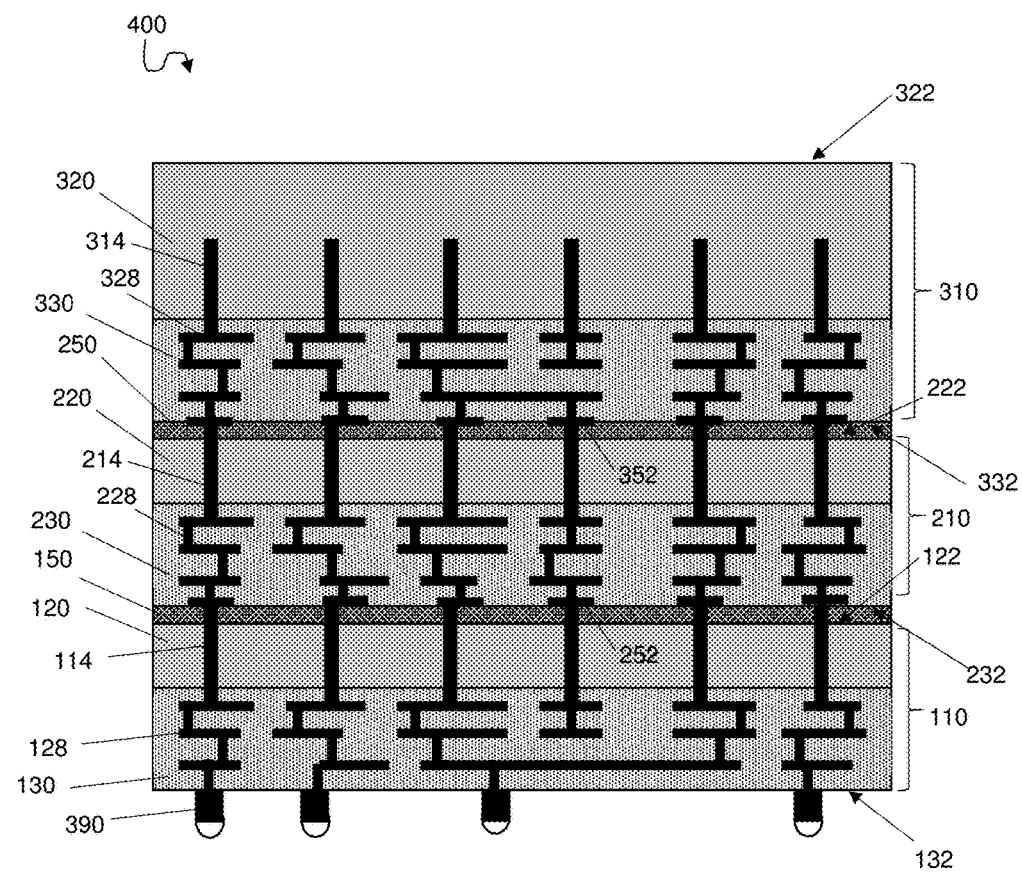

FIG. 8 shows a resulting IC stack 400 where temporary handle wafer 140 (FIG. 7) has been removed. Temporary handle wafer 140 may be removed from front side 132 of wafer 110 when the desired number of wafers are attached to form IC stack 400. Where temporary handle wafer 140 includes a glass and is attached by adhesive 142 (FIG. 7), temporary handle wafer 140 and adhesive 142 may be removed by cleaning or washing. Where temporary handle wafer 140 includes a sacrificial silicon without an adhesive, a backgrind followed by wet or dry etching may be performed to remove the sacrificial silicon to expose dielectric 130 of wafer 110.

IC stack 400 may include a plurality of vertically stacked wafers 110, 210, 310 that are attached via hybrid-oxide bonding. Each wafer 110, 210, 310 may include a back side 122, 222, 322 and a front side 132, 232, 332. Back side 122, 222, 322 of each wafer 110, 210, 310 may include one or more (or a plurality of) TSVs 114, 214, 314 within substrate 120, 220 320. Front side 132, 232, 332 of each wafer 110, 210, 310 may include one or more (or a plurality of) metal lines 128, 228, 328 within dielectric 130, 230, 330. Metal lines 128, 228, 328 may be connected to TSVs 114, 214, 314 within each wafer. More specifically, and referring to FIG. 8, metal lines 128 may be connected with TSVs 114 within wafer 110, metal lines 228 may be connected with TSVs 214 within wafer 210, and metal lines 328 may be connected with TSVs 314 within wafer 310. Dielectric 150, 250 may be interposed between adjacent wafers 110, 210, 310. More specifically, and referring to FIG. 8, dielectric 150 may be interposed between wafer 110 and wafer 210, and dielectric 250 may be interposed between wafer 210 and wafer 310. Vertically stacked wafers 110, 210, 310 may be stacked in a front-to-back orientation such that TSVs 114, 214 on back side 122, 222 of wafers 110, 210 are electrically connected to metal lines 228, 328 on front side 232, 332 of adjacent wafers 210, 310 by extending through dielectrics 150, 250 interposed therebetween. Dielectrics 150, 250 may include an inorganic materials, such as at least one of: hydrogenated silicon oxycarbide (SiCOH), organosilicate glass (OSG), silicon oxide ($SiO_2$), silicon nitride (SiN), flourinated $SiO_2$ (FSG), methylsilesquoxane (MSQ), or porous versions thereof. Dielectric 150, 250 may have a surface that is coplanar with a surface of TSVs 114, 214 on back side 122, 222 of each wafer.

More specifically, and referring to FIG. 8, TSVs 114 on back side 122 of wafer 110 are electrically connected to metal lines 228 on front side 232 of wafer 210 by extending through dielectric 150 and connecting with conductive pads 252 within wafer 210. Additionally, TSVs 214 on back side 222 of wafer 210 are electrically connected to metal lines 328 on front side 332 of wafer 310 by extending through dielectric 250 and connecting with conductive pads 352 within wafer 310. While not shown, the same may be true for TSVs 314 of wafer 310 to another adjacent wafer that may be desired to be attached. It is to be understood that stack 400 may include any number of wafers without departing from aspects of the disclosure.

Still referring to FIG. 8, one or more micropillars 390 may be formed on the back side of the bottommost wafer within stack 400, e.g., front side 132 of wafer 110. Micropillars 390 may include conventional solder bumps which may facilitate connection of stack 400 to another IC chip, device, or stack (not shown). Micropillars 390 may be formed either after removal of temporary handle wafer 140 (FIG. 7) as shown in FIG. 8, or may alternatively be provided on wafer 110 prior to the formation of temporary handle wafer 140. Where temporary handle wafer 140 is formed after the formation of micropillars 390, it may be necessary to include sufficient thicknesses of adhesive 142 (FIG. 7) to substantially surround micropillars 390.

Figure 9:
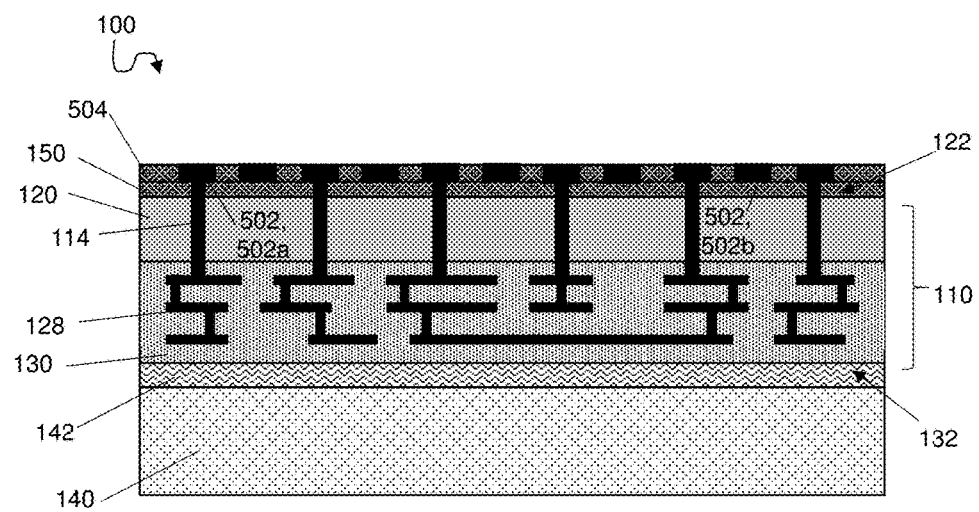
FIGS. 9-10 show cross-sectional view of an integrated circuit stack according to another embodiment of the disclosure.

In another embodiment, as shown in FIG. 9, after dielectric 150 has been formed as was discussed relative to FIG. 4, a plurality of conductive pads 502 may be formed within another dielectric 504. Conductive pads 502 may include active conductive pads 502*a* electrically connected to each TSV 114 and inactive conductive pads 502*b* that are not electrically connected to any other structure within IC structure 100, e.g., TSVs 114. Conductive pads 502 may include any now known or later developed conductive pad material, e.g., materials used for conductive pads 252.

Still referring to FIG. 9, dielectric 504 may be deposited over dielectric 150 and TSVs 114 exposed therein on back side 122 of wafer 110. Conductive pads 502 may be formed within dielectric 504, e.g., by conventional single or dual damascene processes. As known in the art, a single damascene process would include forming trenches or openings within a single layer, filling the trenches or openings with fill material, and planarizing, followed by the process being repeated in another layer. In contrast, a dual damascene process allows for forming of trenches or openings extending within more than one layer, filling the trenches or openings extending within more than one layer simultaneously, and planarizing. In either process, a mask may be used to control where the trenches or openings are formed.

Active conductive pads 502*a* may be formed within dielectric 504 at position where TSVs 114 are located therebelow. In this way, active conductive pads 502*a* may provide the means for connecting TSVs 114 within first wafer 110 to metal lines 230 and conductive pads 252 within second wafer 210. In addition, one or more inactive conductive pads 502*b* may be formed within dielectric 504 to help maintain and control planarization during the damascene processes. Inactive conductive pads 502*b* are so termed because they are not electrically connected to other structures within IC structure 100.

Figure 10:
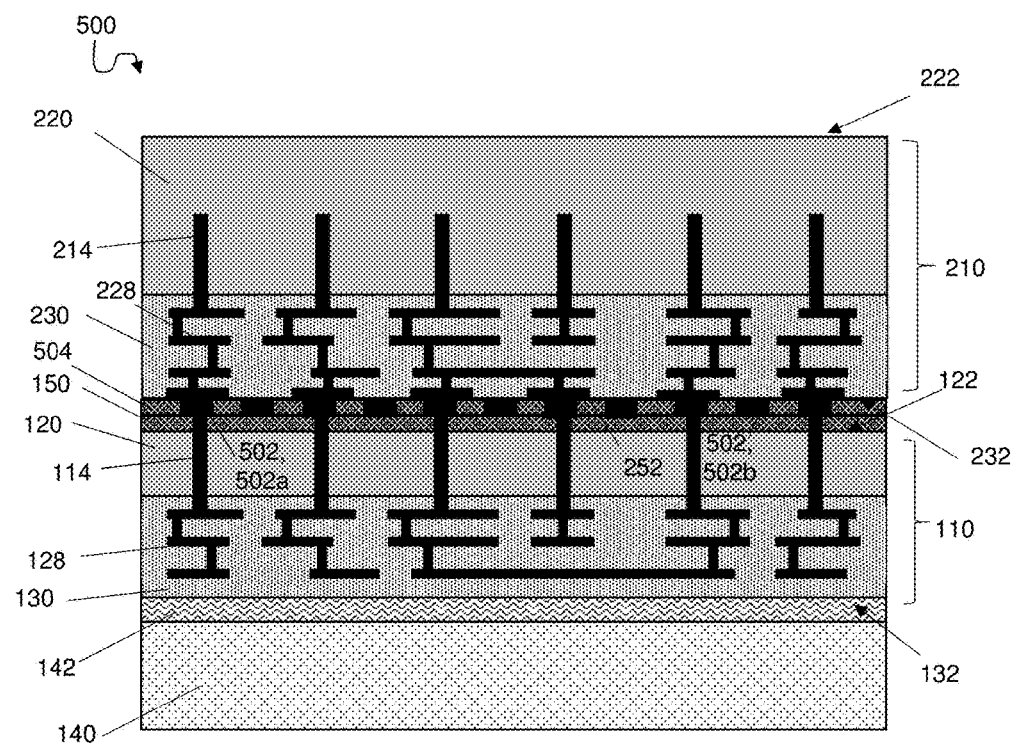

Turning now to FIG. 10, second wafer 210 may be attached to wafer 110 to form an integrated circuit (IC) stack 500. Wafer 210 may be attached to wafer 110 as was described relative to FIG. 5. However, in this embodiment, conductive pads 252 and/or metal lines 228 of wafer 210 are electrically connected to TSVs 114 within wafer 110 via conductive pads 502 within dielectric 504. In addition, the hybrid-oxide bonding takes place between dielectric 504 and conductive pads 502 therein on back side 122 of wafer 110 and dielectric 230 and conductive pads 252 or metal lines 228 on front side 232 of wafer 210. The process according to this embodiment may continue as discussed relative to FIGS. 6-8.

In contrast to conventional IC stacks, the present disclosure provides for attaching wafers in a front-to-back orientation by hybrid-oxide bonding without the need for micropillars or underfill layers between each wafer. As a result, unwanted capacitance and thermal resistance is reduced. In addition, the TSVs of the present disclosure are formed or provided within each wafer prior to wafer attaching. Therefore, there is not a need for a single TSV to be formed after wafer attaching extending through the entirety of the stack. Further, the bonding interface of present disclosure includes a TSV within a substrate on a back side of a first wafer to BEOL structures within a dielectric on the front side of a second adjacent wafer through one or more dielectrics and/or conductive pads that may be disposed therebetween.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the terms "first," "second," and the like, do not denote any order, quantity, or importance, but rather are used to distinguish one element from another. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). "Substantially" refers to largely, for the most part, entirely specified or any slight deviation which provides the same technical benefits of the disclosure.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit stack comprising:
   a first wafer attached to a second wafer in a front-to-back orientation, wherein each wafer includes a back side and a front side, the back side of each wafer including a through-semiconductor-via (TSV) within a substrate, and the front side of each wafer including a metal line within a first dielectric, wherein the metal line is connected with the TSV within each respective wafer; and
   a second dielectric interposed between the substrate of the first wafer and the first dielectric of the second wafer, wherein the TSV of the first wafer extends from the substrate of the first wafer through the second dielectric and is electrically connected to the metal line within the first dielectric of the second wafer.

2. The integrated circuit stack of claim 1, wherein the second dielectric includes an inorganic dielectric material.

3. The integrated circuit stack of claim 2, wherein the inorganic dielectric material includes at least one of: hydrogenated silicon oxycarbide (SiCOH), organosilicate glass (OSG), silicon oxide ($SiO_2$), flourinated $SiO_2$ (FSG), methylsilesquoxane (MSQ), or porous versions thereof.

4. The integrated circuit stack of claim 1, wherein the first wafer and the second wafer are attached by hybrid-oxide bonding.

5. The integrated circuit stack of claim 1, further comprising:
   a micropillar structure being connected to the metal line on the back side of the first wafer.

6. The integrated circuit stack of claim 1, further comprising:
   a third wafer attached to the second wafer, the third wafer including a back side and a front side, the back side of the third wafer including a TSV within a substrate, and the front side of the third wafer including a metal line within a third dielectric, wherein the metal line of the third wafer is connected with the TSV in the third wafer; and
   a fourth dielectric disposed between the substrate of the second wafer and the third dielectric of the third wafer, wherein the TSV of the second wafer extends from the substrate of the second wafer through the fourth dielectric and is electrically connected to the metal line in the third dielectric of the third wafer.

7. The integrated circuit stack of claim 1, further comprising:
   a third dielectric disposed between the second dielectric and the first dielectric of the second wafer; and
   an active conductive pads disposed within the third dielectric providing electrical connection from the TSV of the first wafer and the metal line of the second wafer.

8. The integrated circuit stack of claim 6, further comprising:
   a conductive pad disposed within the first dielectric in the second wafer and providing electrical connection between the TSV of the first wafer and the metal lines of the second wafer.

9. The integrated circuit stack of claim 1, wherein the TSV of each wafer includes a plurality of TSVs and the metal line of each wafer includes a plurality of metal lines, wherein each metal line of the plurality of metal lines within a respective wafer is connected with a corresponding TSV of the plurality of TSVs within the respective wafer, and
   wherein each TSV of the plurality of TSVs of the first wafer extends from the substrate of the first wafer through the second dielectric and is electrically connected to a respective metal line of the plurality of metal lines of the second wafer.

10. An integrated circuit stack comprising:
    a plurality of vertically stacked wafers, each wafer including a back side and a front side, the back side of each wafer including a through-semiconductor-via (TSV) within a substrate, and the front side of each wafer including a metal line within a first dielectric, wherein the metal line is connected with the TSV within each wafer; and
    an inorganic dielectric interposed between adjacent wafers within the plurality of vertically stacked wafer;
    wherein the plurality of vertically stacked wafers are stacked in a front-to-back orientation such that the TSV on the back side of one wafer is electrically connected to the metal line on the front side of an adjacent wafer by extending through the inorganic dielectric interposed therebetween.

11. The integrated circuit stack of claim 10, wherein each of the plurality of vertically stacked wafers are attached to an adjacent wafer in the plurality of vertically stacked wafers via hybrid-oxide bonding.

12. The integrated circuit stack of claim 10, further comprising:
    a micropillar structure being connected to the metal line on the front side of a bottommost wafer of the vertically stacked wafers.

13. The integrated circuit stack of claim 10, wherein the inorganic dielectric includes at least one of: hydrogenated silicon oxycarbide (SiCOH), organosilicate glass (OSG), silicon oxide ($SiO_2$), flourinated $SiO_2$ (FSG), methylsilesquoxane (MSQ), or porous versions thereof.

14. The integrated stack of claim 10, wherein the inorganic dielectric is planar with the TSV on the back side of each wafer.

* * * * *